(12) United States Patent
Bradley

(10) Patent No.: US 6,384,772 B1
(45) Date of Patent: May 7, 2002

(54) WIDEBAND PHASE LOCKING OF LOW OFFSET FREQUENCY SOURCES

(75) Inventor: Donald A. Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 09/562,818

(22) Filed: May 1, 2000

(51) Int. Cl.[7] ................................................. G01S 7/40
(52) U.S. Cl. ....................... 342/172; 342/165; 342/169; 342/170; 375/371; 375/373; 375/376; 455/119; 331/1 R; 331/2; 331/16
(58) Field of Search .................................. 342/165–175, 342/194–197; 331/1 R, 2, 9, 18, 19, 25–29, 34, 46–48, 177 R, 16, 22; 329/306, 307, 308; 375/224, 226, 371, 373, 376; 332/123, 126, 127, 128; 455/119, 76

(56) References Cited

U.S. PATENT DOCUMENTS

| | | | | |
|---|---|---|---|---|
| 3,944,925 A | * | 3/1976 | De Laune | |
| 4,339,826 A | * | 7/1982 | Ogita et al. | 331/22 X |
| 4,602,225 A | * | 7/1986 | Miller et al. | 332/128 |
| 4,604,583 A | * | 8/1986 | Aoyagi et al. | 329/308 |
| 4,679,005 A | * | 7/1987 | Tatami | 331/16 |
| 5,343,168 A | * | 8/1994 | Guthrie | 331/16 |
| 5,451,910 A | * | 9/1995 | Guthrie | 331/16 |
| 5,469,478 A | * | 11/1995 | Lee | 375/376 |

* cited by examiner

Primary Examiner—Bernarr E. Gregory
(74) Attorney, Agent, or Firm—Fliesler Dubb Meyer & Lovejoy, LLP

(57) ABSTRACT

A linear phase detector circuit enables locking of two frequency sources which can operate in the range of 10 GHz with a minimal frequency offset, such as from 0 Hz to 50 KHz. With the frequency sources operating at frequencies F1 and F2 with an offset F2–F1 or F1–F2, the phase detector generates a DC signal indicating a phase offset between a signal F2–F1 or F1–F2 derived from the frequency sources and a reference operating at the desired offset F2–F1 or F1–F2, while eliminating any 2(F2–F1) or 2(F1–F2) component. In this way, the phase detector allows a substantially higher loop bandwidth than the offset F2–F1 or F1–F2, and allows phase tracking independent of the offset. The phase locking circuitry is useful in applications such as providing a variable Doppler shift in a radar signal.

12 Claims, 6 Drawing Sheets

WIDEBAND PHASE LOCKING OF LOW OFFSET FREQUENCY SOURCES

BACKGROUND OF THE INVENTION

1. Field of the Invention

The present invention relates to phase locking two frequency sources together with offset frequencies, with the offset being substantially less than a tracking loop frequency response.

2. Description of the Related Art

Two frequency sources can be phase locked with a slight frequency offset using several conventional methods. If the desired offset is in the 1 Hz to 10 KHz range while the frequency sources operate near 10 GHz, undesirable design tradeoffs may result as detailed below.

A first circuit for phase locking two frequencies F1 and F2 with a small offset is illustrated in FIG. 1. The circuit includes two frequency synthesizers 102 and 104 phase locked to the same reference oscillator 100. Each synthesizer essentially is a phase locked loop (PLL). The synthesizers 102 and 104 include a phase detector having a first input connected to the reference oscillator 100 and a second input provided from a voltage controlled oscillator (VCO) providing the synthesizer output. The VCO has its output downconverted by a ÷N frequency divider to the frequency of the reference oscillator 100. The output of the phase detector provides a voltage indicating any phase difference between its inputs to control the VCO so that its frequency is phase locked with the oscillator 100. To provide the two synthesizers operating in the range as high as 10 GHz while still faithfully tracking the reference oscillator with an offset of 1 Hz to 10 KHz requires instrument grade synthesizers which are large and expensive. Such instrument grade synthesizers may be undesirable.

A second method of phase locking two frequency sources with a slight frequency offset is illustrated in FIG. 2. The circuit in FIG. 2 includes a first oscillator 200 set with an output frequency F1 and a second oscillator 202 with an output frequency F2 slightly offset from F1. The output of the oscillators 200 and 202 are mixed in mixer 204 to provide signals at frequencies F2−F1 and F2+F1. The output from mixer 204 is provided through a filter 206 to eliminate the F2+F1 component and pass the desired offset Fs=F2−F1. The output of the filter 206 is applied to a first input of a digital frequency/phase detector 208. A second input of the phase detector 208 is provided from an offset reference oscillator 210 operating at the desired offset frequency Fs=F2−F1. The phase detector 210 then provides an output indicating the phase/frequency difference between its inputs to a loop amplifier 212 which drives the tracking oscillator 202.

The loop bandwidth is typically constrained to 1/10 the offset Fs due to phase detector sampling limitations. The digital phase detector 208 typically operates using a sampling process that is updated on the rising or falling edge of the phase detector inputs. The sampling process has the same effect as a sample and hold circuit, where information is updated at a sampling frequency Fs. For a 1 Hz offset, the information into the loop amplifier 212 is updated every second. With a phase lag of 360° between the signals provided to the phase detector 208, a pole is thus generated in the signal path with a 3 dB corner frequency at approximately 0.125 Hz with a phase shift of 45°.

A third approach would be to use a circuit with a linear phase detector, such as the four quadrant multiplier 300 shown in FIG. 3. The four quadrant multiplier 300 offers an advantage over a digital phase detector because it instantaneously responds to phase changes, so loop bandwidth will not be constrained to 1/10 Fs. A first input to the four quadrant multiplier 300 is provided from mixer 204 which mixes signals at frequencies F1 and F2 from signal sources 200 and 202 to provide a signal F2−F1 to the first input of the multiplier 300. A second input to the four quadrant multiplier 300 is provided from offset oscillator 210 which provides a signal at the desired offset frequency Fs=F2−F1. The four quadrant multiplier 300 then multiplies the analog signals provided to its inputs to provide a product signal 2Fs along with a DC signal indicating the phase difference $\phi$ between the inputs. The 2Fs signal can be filtered out using the filter 302 so that only the phase difference signal $\phi$ is provided to control the tracking oscillator 202.

Although filtering with filter 302 can remove the high frequency sum component 2Fs, with the offset being 1 Hz the filter 302 must be a 2 Hz device. The phase shift of the filter 302 will be at least 45° times the number of poles generated at the 3 dB point. To reject the 2 Hz signal, a filter 212 would need to be at least 1.5 Hz with 5 to 6 poles at the 3 dB point of approximately 0.125 Hz. This would leave a designer no choice but to limit the loop bandwidth within 1/10 Fs to minimize phase shift within the control loop.

SUMMARY OF THE INVENTION

In accordance with the present invention, a linear phase detector is provided that cancels the 2Fs term while retaining the instantaneous bandwidth DC phase difference determination associated with a linear phase detector. In effect, an image reject mixer is provided with a DC phase difference component enhanced, and any 2Fs frequency component cancelled.

In accordance with the present invention, referring to FIG. 4, a linear phase detector is provided including an oscillator 400 and a VCO 402 operating with a slight frequency offset (F2−F1) or (F1−F2) from the oscillator 400, along with additional circuitry for phase locking the offset between the oscillator 400 and VCO 402 with another oscillator 404 operating at the desired offset (F2−F1) or (F1−F2). The phase locking circuitry includes a power splitter 406 for distributing the signal from oscillator 400 to the first input of mixers 408 and 410. A power splitter 412 distributes the signal from VCO 402 to the second input of mixer 410 and to the second input of mixer 408 with a phase shift $\phi 1$ in phase shifter 414 to generate first I and Q signals from the mixers 408 and 410. Higher frequency components of the first I and Q signals are filtered out and the signals are applied to first inputs of multipliers 422 and 424.

The oscillator 404 operates at the desired offset frequency (F2−F1) or (F1−F2). The output of the oscillator 404 is provided directly to multiplier 422 to provide a second I signal multiplied by the first Q signal. The output of oscillator 404 is further provided to multiplier 424 through a phase shifter 426 to multiply a second Q signal by the first I signal. The phase shifter 426 provides a phase shift $\phi 1$ matching the phase shift of phase detector 414 for F2−F1, or provides a phase shift $\phi 1$ matching the phase shift of phase detector 414 with an additional 180° for F1−F2. The output of multiplier 422 is subtracted from the output of multiplier 424 in summer 428. The output of summer then provides a voltage control signal to VCO 402 with no |F1+F2| component.

As configured, the phase locking circuitry creates a phase detector, so that the output of the summer 428 provides a DC signal sin($\phi 2$), where $\phi 2$ is a phase difference between the signal F2−F1 or F1−F2 combined from oscillator 400 and VCO 402 and the signal F2−F1 or F1−F2 from the reference oscillator 404. Any 2(F2−F1) or 2(F1−F2) component is canceled. The circuitry enables stable tracking of a minimal frequency offset such as from 0 Hz to 50 KHz with the oscillators providing F1 and F2 operating in the range of 10 GHz with loop bandwidth independent of Fs. The phase locking circuitry is useful in applications like providing a variable Doppler shift for a radar signal.

BRIEF DESCRIPTION OF THE DRAWINGS

Further details of the present invention are explained with the help of the attached drawings in which.

DETAILED DESCRIPTION

Figure 1:
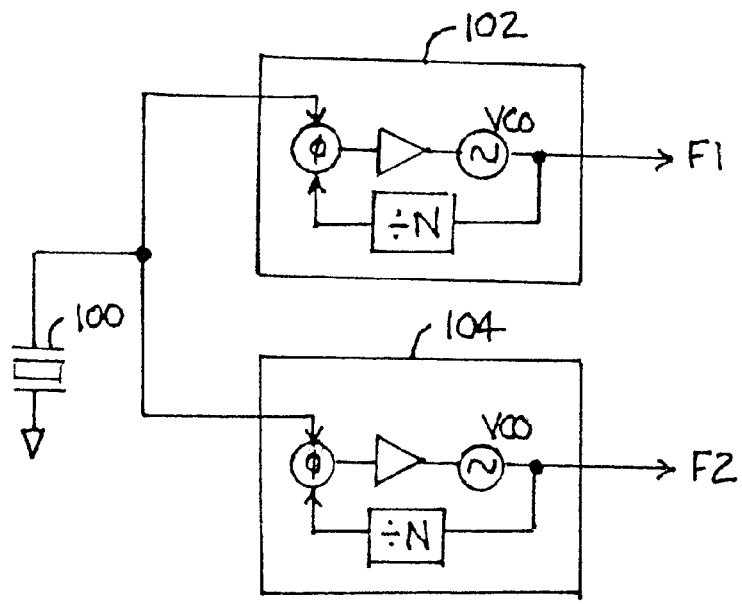
FIG. 1 shows a first circuit for phase locking two signals with a small frequency offset using high grade synthesizers.
Figure 2:
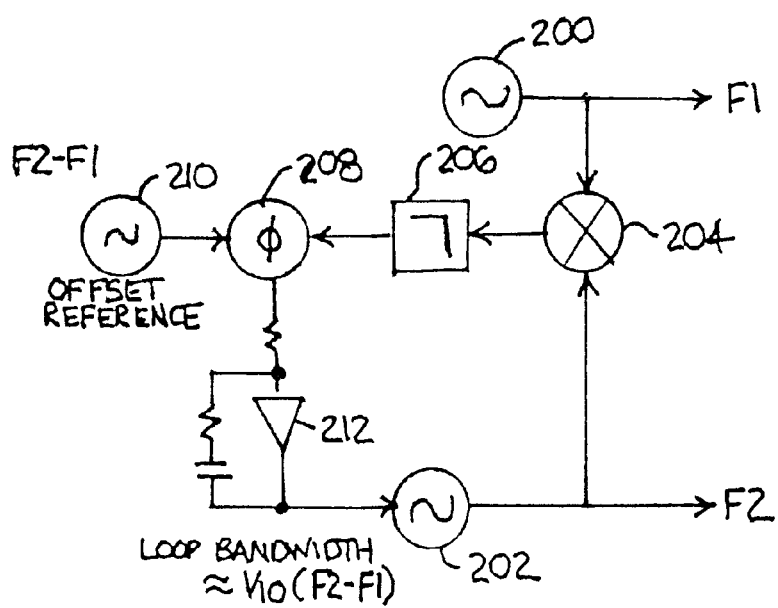
FIG. 2 shows a second circuit for phase locking two signals with a small frequency offset using a digital phase detector.
Figure 3:
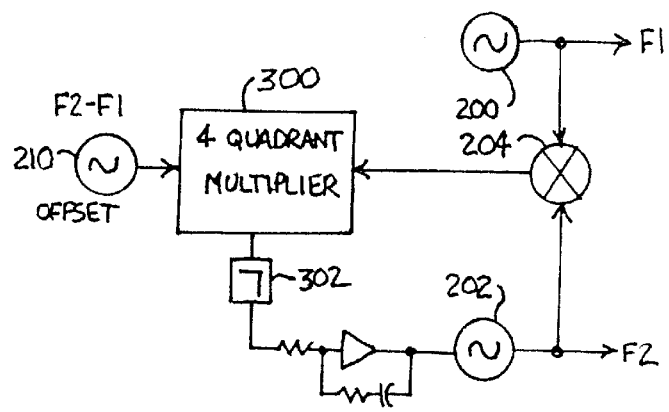
FIG. 3 shows a third circuit for phase locking two signals with a small frequency offset using a four quadrant multiplier.
Figure 4:
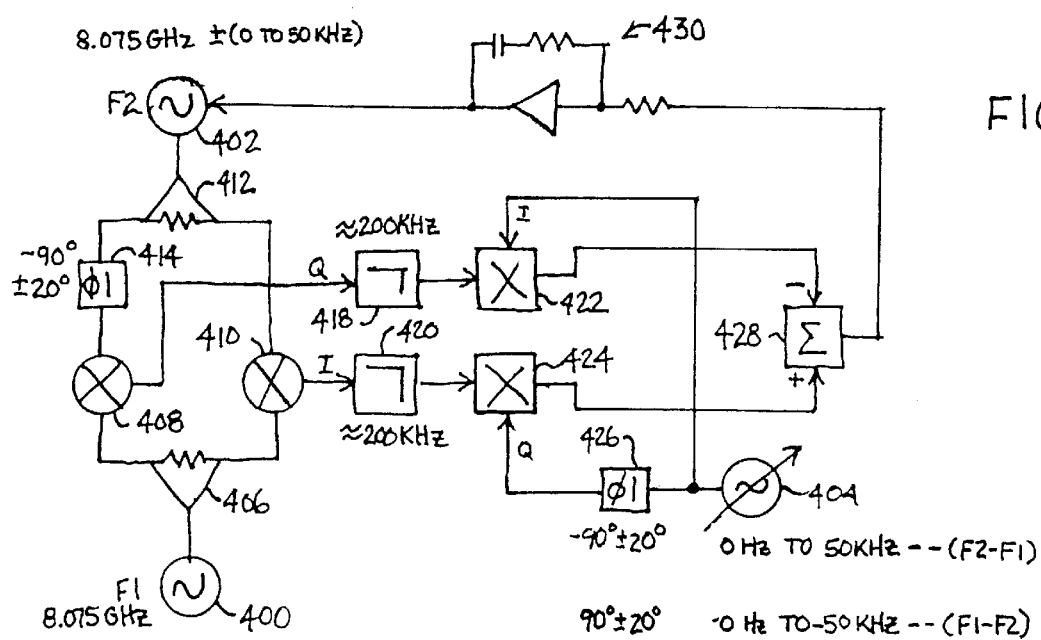
FIG. 4 shows a circuit for phase locking two signals having a frequency offset with a reference signal operating at the offset according to the present invention.

FIG. 4 shows a circuit for phase locking two signals having a frequency offset with a reference signal operating at the frequency offset according to the present invention. The circuit includes a fixed oscillator 400 operating at a frequency F1 and a voltage controlled oscillator (VCO) 402 operating at a frequency F2. The VCO 402 operates with a controlled offset, which for example might be used to provide a Doppler shift. A representative operating frequency for F1 is shown as 8.075 GHz. The VCO 402 operates at a frequency F2 which can be offset from the F1 frequency of 8.075 GHz by a value ranging from 0 Hz to ±50 KHz. The circuit of FIG. 4 further includes a reference oscillator 404 with a frequency set to the desired offset F2−F1 or F1−F2, shown here as ranging from 0 Hz to ±50 KHz to match the offset range of F2. The operating frequencies for components in FIG. 4 are shown for purposes of illustration. Components may be used which operate at other frequencies depending on specific design requirements.

The output of the oscillator 400 is split by power divider 406 to provide signals to a first input of each mixer 408 and 410. The output of VCO 402 is split by power divider 412. A first output of the power divider 412 is provided to a second input of mixer 410. A second output is provided through a phase shifter 414 to a second input of mixer 408. The phase shifter 414 is shown with a variation of −90°±20°, or from −70° to −110°. Although specific phase shift ranges are shown for the phase shifter 414, a fixed −90° phase shifter, or a phase shifter with an alternative phase shifting range could be used depending on specific design requirements.

The output of the mixer 408 is provided through a low pass filter 418 to a first input of a multiplier 422. The output of mixer 410 is provided through a low pass filter 420 to a first input of multiplier 424. The filters 418 and 420 are shown to operate over a 200 KHz bandwidth, although other filter bandwidths might be used depending on design requirements. A second input to the multiplier 422 is provided from the reference oscillator 404. A second input to multiplier 424 is provided from the reference oscillator 404 through a phase shifter 426. The phase shifter 426 is controlled to match the offset $\phi 1$ of the phase shifter 414 at all frequencies for F2−F1, and controlled to add 180° to the matched offset of $\phi 1$ for F1−F2.

The outputs of the multipliers 422 and 424 are provided to inputs of a summer 428 so that the output of multiplier 422 is subtracted from the output of multiplier 424 to provide a signal at the output of summer 428. The output from the summer 428 is then provided through a loop amplifier 430 to a voltage control input of the VCO 402. The loop bandwidth has no limitations due to (F2−F1) or (F1−F2), as the signal path from oscillator 402 through summer 428 has no phase shift.

Figure 5:
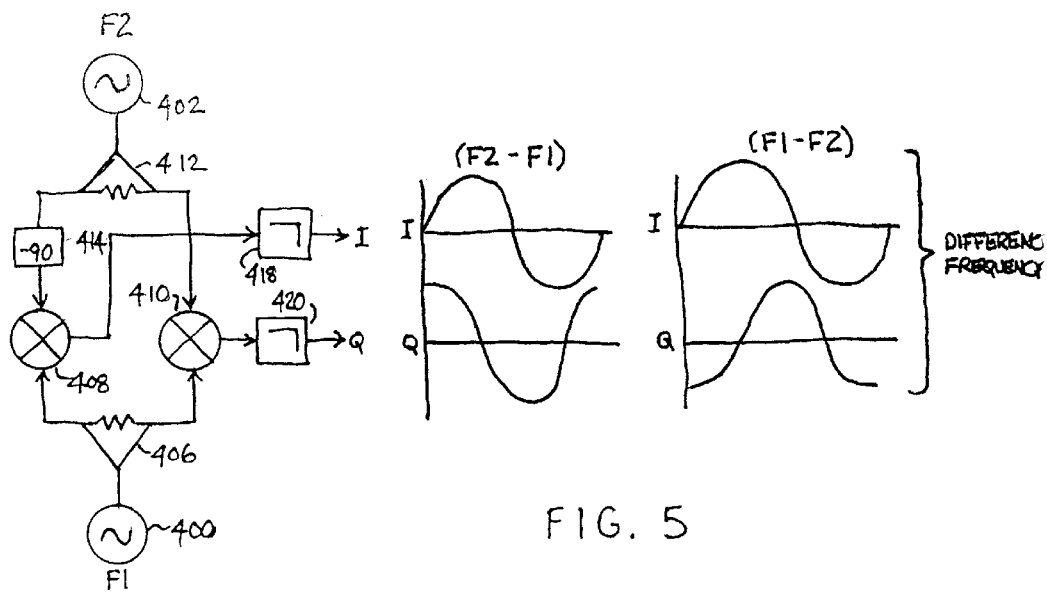
FIG. 5 illustrates I and Q signals generated from the oscillators 400 and 402 of FIG. 4 and provided at the output of the filters 418 and 420.
Figure 6:
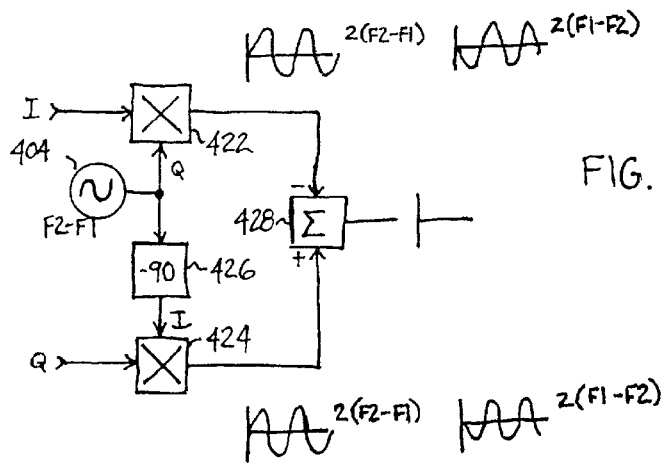
FIG. 6 illustrates multiplication of I and Q signals from mixers 408 and 410 of FIG. 5 by I and Q signals from the desired reference oscillator 404 to provide two signals 2(F2−F1) of 2(F1−F2) at the output of multipliers 422 and 424.

In operation, quadrature signals (I,Q) will be generated using mixers 408 and 410 and provided at the output of the filters 418 and 420 as shown in FIG. 5. As illustrated, a difference frequency will exist between the I and Q signals. Next, the first I and Q signals from mixers 408 and 410 are multiplied by second I and Q signals from oscillator 404 operating at the desired offset (F2−F1) or (F1−F2) to provide two signals 2(F2−F1) or 2(F1−F2) as shown in FIG. 6 at the output of multipliers 422 and 424. The output from multipliers 422 and 424 are then subtracted in summer 428 to cancel the 2(F2−F1) or 2(F1−F2), or the 2Fs component.

An analysis is provided below to show that a DC signal indicating phase deviation remains and is provided from the output of summer 428. In the analysis, the phase shift $\phi 1$ of phase shifters 414 and 426 will be assumed to be −90°. Further, a phase shift $\phi 2$ will represent the phase difference between the signal from the reference oscillator 404 and the phase of the difference frequency F2−F1 or F1−F2 from the outputs of oscillators 400 and 402.

Figure 7:
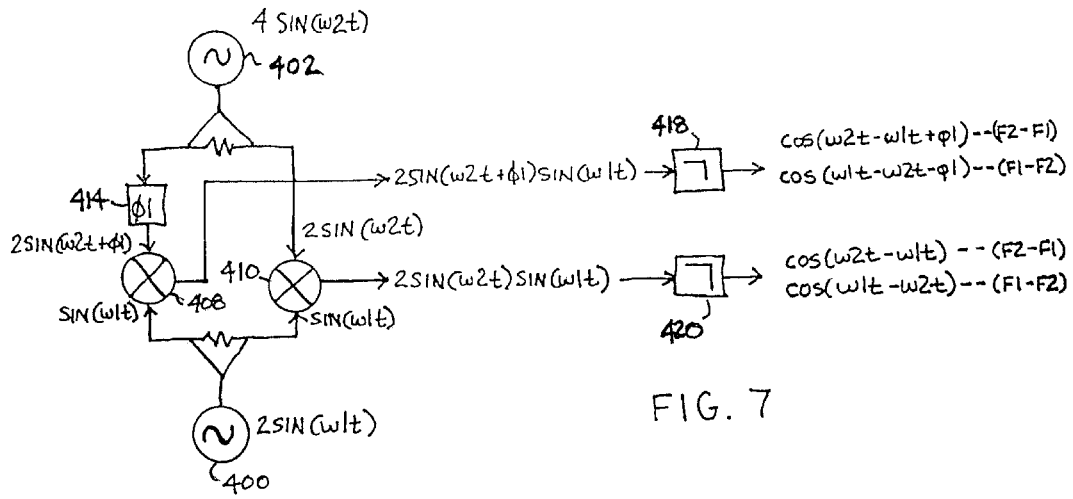
FIG. 7 illustrates specific signals generated from oscillators 400 and 402 and the output provided from filters 418 and 420.

Referring to FIG. 7, we assume a signal 2 sin($\omega 1 t$) is provided from oscillator 400 and a signal 4 sin($\omega 2 t$) is provided from VCO 402. The signal from the VCO 402 as provided through phase shifter 414 to mixer 408 is then 2 sin($\omega 2 t + \phi 1$). The signal from oscillator 400 provided to the mixer 408 is sin($\omega 1 t$). The output of mixer 408 is, thus, 2 sin($\omega 2 t + \phi 1$)sin($\omega 1 t$). The signal from the VCO 402 as provided to mixer 410 is 2 sin($\omega 2 t$), and the signal from oscillator 400 to the mixer 410 is sin($\omega 1 t$). The output of mixer 410 is, thus 2 sin($\omega 2 t$)sin($\omega 1 t$).

The equation (1) below is applied to show how filters 418 and 420 filter out a higher frequency portion of the signal from the outputs of mixers 408 and 410.

$$\sin(A)\sin(B) = \tfrac{1}{2}(\cos(A-B) - \cos(A+B)) \quad (1)$$

Applying equation (1), the output of mixer 408 is as follows:

$$2\sin(\omega 2t + \phi 1)\sin(\omega 1t) = \cos(\omega 2t + \phi 1 - \omega 1t) -$$
$$\cos(\omega 2t + \phi 1 + \omega 1t) \text{ or}$$
$$= \cos(\omega 1t - \omega 2t - \phi 1) -$$
$$\cos(\omega 2t + \phi 1 + \omega 1t)$$

The filter 418 eliminates the higher frequency portion cos(ω2t+φ1+ω1t), leaving either cos(ω2t+φ1−ω1t) or cos(ω1t−ω2t−φ1), depending on which of F2−F1 or F1−F2 is positive, to be provided at the output of filter 418.

Applying equation (1), the output of mixer 410 is obtained as follows:

$$2\sin(\omega 2t)\sin(\omega 1t) = \cos(\omega 2t - \omega 1t) - \cos(\omega 2t + \omega 1t) \text{ or}$$
$$= \cos(\omega 1t - \omega 2t) - \cos(\omega 2t + \omega 1t)$$

The filter 420 eliminates the higher frequency portion cos(ω2t+ω1t), leaving either cos(ω2t−ω1t) or cos(ω1t−ω2t), depending on which of F2−F1 or F1−F2 is positive, to be provided at the output of filter 420.

Figure 8:
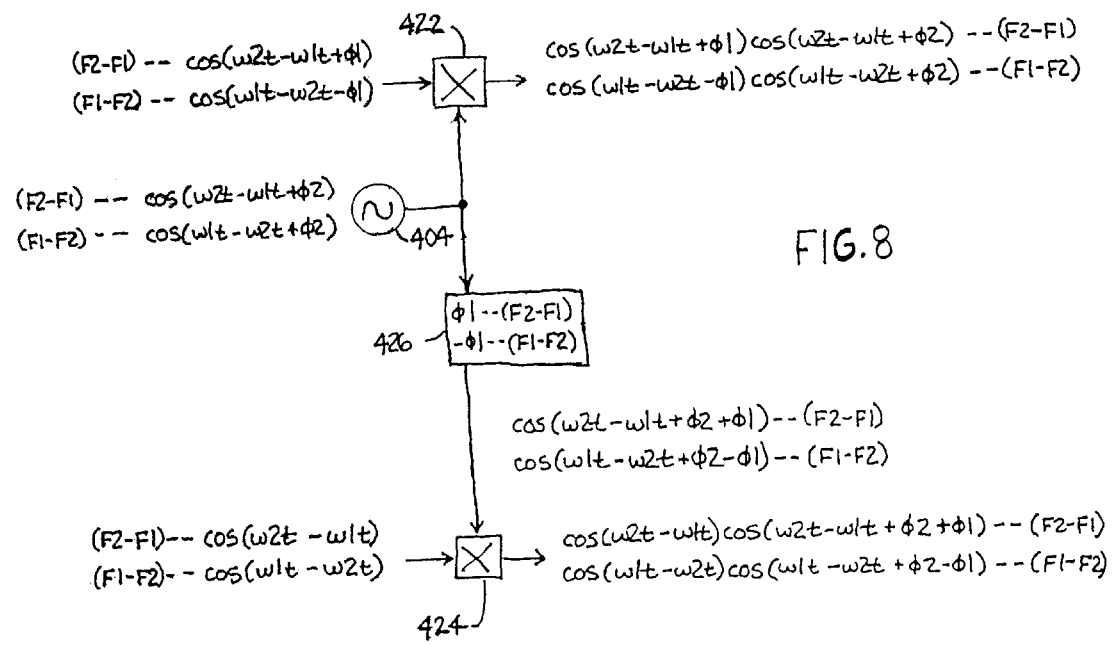
FIG. 8 illustrates the signals provided from the filters 418 and 420 of FIG. 7 and multiplied with the a specific signal from the reference oscillator 404 to provide outputs from multipliers 422 and 424.

Referring to FIG. 8, the two signals from the output of filters 418 and 420 are applied to the first input of respective multipliers 422 and 424. The second input of the multipliers 422 and 424 receive the signal cos(ω2t−ω1t+φ2) or cos(ω1t−ω2t+φ2) from oscillator 404 which has a reference frequency of (ω2t−ω1t) or (ω1t−ω2t) and an arbitrary phase offset φ2. The signal from oscillator 404 is received directly at the second input of multiplier 422. The signal from oscillator 404 is received at the second input of multiplier 424 through the phase shifter 426 to create the signal cos(ω2t−ω1t+φ2+φ1) or cos(ω1t−ω2t+φ2−φ1). The output of mixer 422 is, thus, cos(ω2t−ω1t+φ1)cos(ω2t−ω1t+φ2) or cos(ω1t−ω2t−φ1)cos(ω1t−ω2t+φ2) and the output of mixer 424 is cos(ω2t−ω1t)cos(ω2t−ω1t+φ2+φ1) or cos(ω1t−ω2t) cos(ω1t−ω2t+φ2−φ1).

Figure 9:
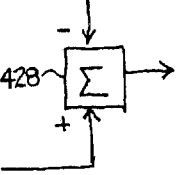
FIG. 9 illustrates signals provided from the multipliers 422 and 424 of FIG. 8 as applied to summer 428.

With the output of the multipliers 422 and 424 applied to the inputs of summer 428, as illustrated in FIG. 9, equations (2), (3) and (4) below can be applied to determine the output of the summer 428.

$$\cos(A)\cos(B) = \tfrac{1}{2}(\cos(A-B) + \cos(A+B)) \quad (2)$$
$$\cos(-A) = \cos(A) \quad (3)$$
$$\cos(A+B) - \cos(A-B) = -2\sin(A)\sin(B) \quad (4)$$

The equations for F2−F1 are first solved below using equations (2), (3) and (4). Applying equation (2) to the output for F2−F1 of the mixer 422, the following relation is obtained:

$$\cos(\omega 2t - \omega 1t + \phi 1)\cos(\omega 2t - \omega 1t + \phi 2) =$$
$$1/2(\cos(\omega 2t - \omega 1t + \phi 1 - \omega 2t + \omega 1t - \phi 2) +$$
$$\cos(\omega 2t - \omega 1t + \phi 1 + \omega 2t - \omega 1t + \phi 2) =$$
$$1/2(\cos(\phi 1 - \phi 2) + \cos(2\omega 2t - 2\omega 1t + \phi 1 + \phi 2))$$

Applying equation (2) to the output for F2−F1 of the mixer 424, the following relation is obtained:

$$\cos(\omega 2t - \omega 1t)\cos(\omega 2t - \omega 1t + \phi 1 + \phi 2) =$$
$$1/2(\cos(\omega 2t - \omega 1t - \omega 2t + \omega 1t - \phi 2 - \phi 1) +$$
$$\cos(\omega 2t - \omega 1t + \omega 2t - \omega 1t + \phi 2 + \phi 1)) =$$
$$1/2(\cos(-\phi 2 - \phi 1) + \cos(2\omega 2t - 2\omega 1t + \phi 1 + \phi 2))$$

Subtracting the output of multiplier 422 from the output of multiplier 424 in subtractor 428 for the equations for F2−F1, the following equation is obtained:

−½(cos(φ1−φ2)+cos(2ω2t−2ω1t+φ1+φ2))+½(cos(−φ2−φ1)+
cos(2ω2t−2ω1t+φ1+φ2))=½cos(−φ2−φ1)−½cos(φ1−φ2)

Using the relationship of equation (3) the following is then obtained:

½ cos(−φ2−φ1)−½ cos(φ1−φ2)=½ cos(φ2+φ1)−½ cos(φ1−φ2)

Using the relationship of equation (4) the following is then obtained:

½(cos(φ2+φ1)−cos(φ1−φ2))=−sin(φ1)sin(φ2)

For F2−F1, assuming that φ=−90°, then −sin(−90°)=1, so the relation −sin(φ1)sin(φ2) becomes sin(φ2) indicating that the circuit of FIG. 4 does operate like a traditional phase detector.

For F1−F2, the output of the subtractor 428 can be reduced using equations (2), (3) and (4), as illustrated in FIG. 9, to ½(cos(φ1−φ2)−cos(φ1+φ2)=sin(φ1)sin(φ2)

For F1−F2, assuming that φ1=90°, then sin(90°)=1, so the relation sin(φ1)sin(φ2) becomes sin(φ2) indicating that the circuit of FIG. 4 still operates like a traditional phase detector.

Although satisfying in the form of sin(φ2) it is not necessary to provide φ1 at exactly ±90°, since φ1 in phase shifter 414 is matched in phase shifter 426. A non ±90° phase shift will only vary the gain of the output of the phase detectors 414 and 426. A variation of −90°±20°, or +90°±20° only changes the phase detector gain by approximately −0.5 dB.

Figure 10:
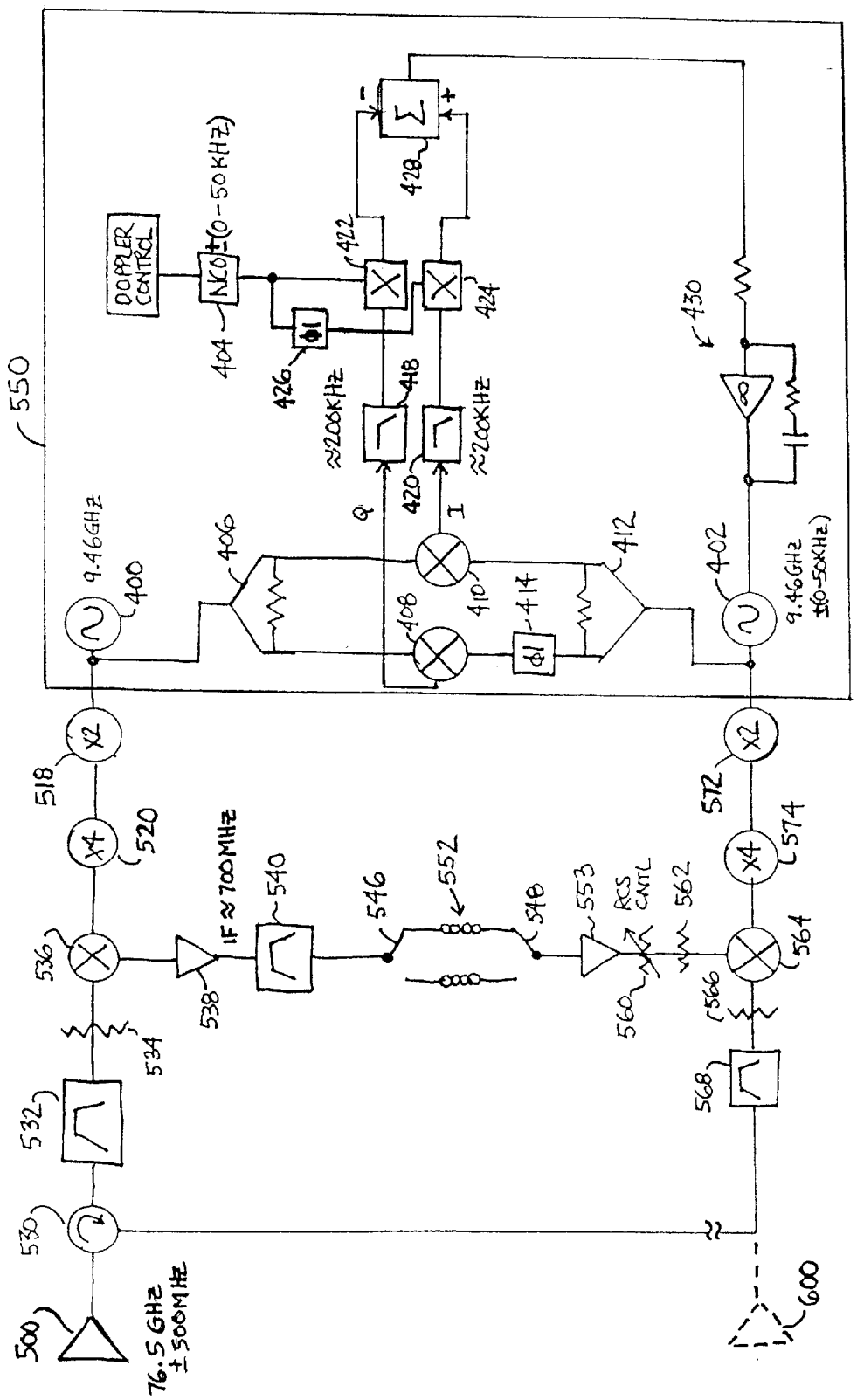
FIG. 10 shows a phase detector circuit in accordance with the present invention used in a radar test simulator.

One use for providing a controlled offset in accordance with the present invention is to provide a Doppler shift for a radar target simulator (RTS). A block diagram for a RTS designed for testing an automobile collision avoidance radar is shown in FIG. 10. The RTS antenna 500 is designed to receive a signal in the range of 76.5±0.5 GHz to cover the full 76–77 GHz frequency range allocated by the Federal Communications Commission (FCC) for collision avoidance radar systems used in the United States.

A signal from the antenna 500 is provided to one terminal of a circulator 530. A second terminal of the circulator (530) provides the signal through a bandpass filter 532 and attenuator pad 534 to a first input of a harmonic downconverter 536. The bandpass filter 532 serves to limit signals outside the desired 76–77 GHz region of the signal from antenna 500. A second LO input of the downconverter 536 is provided from the oscillator 400 through a ×2 multiplier 518 and a ×4 multiplier 520. The oscillator 400 is shown providing a signal with a frequency of 9.46 GHz. The output of the downconverter 536 then provides an IF signal of approximately 700 MHz.

The output of the downconverter 536 provides the IF signal through an amplifier 538 and bandpass filter 540. The bandpass filter 540 is designed to operate over the desired IF bandwidth and eliminate signals outside the IF bandwidth. The signal from the bandpass filter 540 is provided to a pair of switches 546 and 548. The switches 546 and 548 are controlled to connect a desired delay device 552 between the output of the bandpass filter 540 and the input of an amplifier 553. The output of amplifier 553 is provided through a radar cross section (RCS) control attenuator 560 and pad 562 to a first input of a harmonic upconverter 564. The output of upconverter 564 is then provided for retransmission.

To simulate the delay and amplitude of a target with the specified radar cross section (RCS) at a particular range, the desired delay device from devices 552 is connected between the switches 546 and 548. The delay devices might include different length transmission lines or a bulk acoustic wave delay (BAW) device. The amplitude of the signal from the selected delay device can be controlled by RCS control attenuator 560 so that a signal retransmitted by the RTS simulates a return from a target having the specified RCS spaced the particular distance from the antenna 500.

To provide upconversion, a second LO input of the upconverter 564 is received from a VCO 402 through a x2 multiplier 572 and a x4 multiplier 574. The output of the upconverter 564 is provided through a pad 566 and bandpass filter 568 to a third terminal of the circulator 530. The bandpass filter 568 serves to eliminate undesirable mixing products from the output of upconverter 564.

The upconverted signal from the output of the bandpass filter 568 is provided to the circulator for retransmission from the antenna 500. Alternatively, the upconverted signal from the bandpass filter 568 can be retransmitted from a separate antenna 600 shown here in dashed lines. If the separate transmit antenna 600 is used, the circulator 530 can be replaced by a direct connection from the receive antenna 500 to the bandpass filter 532, and the connection from the output of the bandpass filter 568 to the circulator 530 can be eliminated.

The oscillator 400 and VCO 402 form part of a phase locked loop PLL structure 550 which utilizes the components of FIG. 4 to provide a controlled Doppler frequency offset. A frequency for the VCO 402 is shown as 9.46 GHz, matching that of oscillator 400 but with a 0–50 KHz Doppler offset range added. The Doppler offset is substantially less than the loop frequency of a typical phase locked loop (PLL) which might be used to enable the VCO 402 to track the phase of oscillator 404 for a given frequency offset from oscillator 400. With an offset substantially less than a tracking loop frequency, a typical PLL would likely be unstable or too slow to track out short term variations between oscillators 400 and 402. The circuit structure 550 prevents such shortcomings.

The components of circuit 550 carried over from the circuit of FIG. 4 are similarly labeled and function as described in FIG. 4 to provide a controlled frequency offset between oscillator 400 and VCO 402. The frequency ranges of components of the circuit 550 are slightly varied from those in FIG. 4, although different frequency components may be used depending on specific design requirements. The oscillator 404 of the circuit is shown as a numerically controlled oscillator which receives a Doppler control input.

For the circuit of FIG. 10, the upconverted signal which has been delayed by a delay line 552 and retransmitted from the antenna 500 enables the RTS to function as a transponder and to simulate a target spaced a desired distance from a radar. A Doppler offset provided during upconversion allows simulation of a target moving at F2−F1 or moving from F1−F2 a desired rate of speed relative to the radar being tested.

Although the invention has been described above with particularity, this was merely to teach one of ordinary skill in the art how to make and use the invention. Many modifications will fall within the scope of the invention, as that scope is defined by the following claims.

What is claimed is:

1. A circuit for phase locking a frequency offset between a first oscillator (400) and a second oscillator (402) with a desired offset signal from a reference oscillator 404, the circuit comprising:
   a first mixer (410) having a first input coupled to an output of the first oscillator (400), a second input coupled to an output of the second oscillator (402), and having an output;
   a first phase shifter (414) having an input coupled to the output of the second oscillator (402), and having an output;
   a second mixer (408) having a first input coupled to the output of the first oscillator (400), a second input coupled to the output of the first phase shifter (414), and having an output;
   a first filter (420) having an input coupled to the output of the first mixer (410), and having an output;
   a second filter (418) having an input coupled to the output of the second mixer (408), and having an output;
   a first multiplier (422) having a first input coupled to the output of the second filter (418), a second input coupled to an output of the reference oscillator (404), and having an output;
   a second phase shifter (426) having a first input coupled to the output of the reference oscillator (404), and having an output;
   a second multiplier (424) having a first input coupled to the output of the first filter (420), a second input coupled to the output of the second phase shifter (426), and having an output; and
   a subtractor (428) having a first input coupled to the output of the first multiplier (422), a second input coupled to the output of the second multiplier (424), and having an output coupled to a frequency control input of the second oscillator (402), the output of the subtractor providing a signal composed of a signal from the output of the first multiplier (422) subtracted from a signal from the output of the second multiplier (424).

2. The circuit of claim 1, wherein the first phase shifter (414) and the second phase shifter (426) provide an approximately equal phase shift.

3. The circuit of claim 2, wherein the phase shift of the first phase shifter (414) and the second phase shifter (426) is approximately −90°.

4. The circuit of claim 1, wherein the first phase shifter (414) provides a phase shift of approximately 180° from the second phase shifter (426).

5. The circuit of claim 4, wherein the phase shift of the first phase shifter (414) is approximately −90° and the phase shift of the second phase shifter (426) is approximately 90°.

6. The circuit of claim 1, wherein the second oscillator (402) is a voltage controlled oscillator (VCO), and wherein the first filter (420) and the second filter (418) are low pass filters.

7. A method for providing a voltage for phase locking a frequency offset between a signal from a first oscillator (400) and a signal from a second oscillator (402) with a desired offset from a reference oscillator (404), the method comprising the steps of:
   mixing the signal from the first oscillator (400) with the signal from the second oscillator (402) to provide a first in phase (I) signal:

mixing the signal from the first oscillator (400) with approximately a −90° phase shift with the signal from the second oscillator (402) to provide a first in quadrature (Q) component;

filtering the first (I) signal and the first (Q) signal to remove a high frequency component;

providing a second in phase (I) signal from the reference oscillator (404) with the desired offset frequency;

providing a second in quadrature (Q) signal by phase shifting a signal from the reference oscillator (404);

multiplying the first (Q) signal with the second (I) signal to provide a first multiplied signal;

multiplying the first (I) signal with the second (Q) signal to provide a second multiplied signal; and subtracting the first multiplied signal from the second multiplied signal to provide the voltage indicating a phase difference between a signal indicating a frequency difference between signals from the first oscillator (400) and the second oscillator (402), and a signal from the reference oscillator.

8. The method of claim 7, wherein in the step of providing a second in quadrature (Q) signal by phase shifting a signal from the reference oscillator (404), the phase shift is approximately −90°.

9. The method of claim 7, wherein in the step of providing a second in quadrature (Q) signal by phase shifting a signal from the reference oscillator (404), the phase shift is approximately 90°.

10. A radar test system comprising:

an antenna (500) for receiving a radar signal;

an isolator (530) having a first terminal coupled to the antenna, a second terminal and a third terminal;

a downconverting mixer (536) having a first input coupled to the second terminal of the isolator, a second input and an output;

a first oscillator (400) having an output coupled to the second input of the downconverting mixer (536);

a second oscillator (402) having an output;

a bandpass filter (540) having an input coupled to the output of the downconverting mixer, and having an output;

a delay means (552) having an input coupled to the bandpass filter (540) and having an output;

an upconverting mixer (564) having a first input coupled to the output of the delay means (552), a second input coupled to the output of the second oscillator (402), and an output coupled to the third terminal of the isolator (530);

a first mixer (410) having a first input coupled to the output of the first oscillator (400), a second input coupled to the output of the second oscillator (402), and having an output;

a first phase shifter (414) having an input coupled to the output of the second oscillator (402), and having an output;

a second mixer (408) having a first input coupled to the output of the first oscillator (400), a second input coupled to the output of the first phase shifter (414), and having an output;

a first filter (420) having an input coupled to the output of the first mixer (410), and having an output;

a second filter (418) having an input coupled to the output of the second mixer (408), and having an output;

a reference oscillator (404) having an output;

a first multiplier (422) having a first input coupled to the output of the second filter (418), a second input coupled to the output of the reference oscillator (404), and having an output;

a second phase shifter (426) having a first input coupled to the output of the reference oscillator (404), and having an output;

a second multiplier (424) having a first input coupled to the output of the first filter (420), a second input coupled to the output of the second phase shifter (426), and having an output; and a subtractor (428) having a first input coupled to the output of the first multiplier (422), a second input coupled to the output of the second multiplier (424), and having an output coupled to a frequency control input of the second oscillator (402), the output of the subtractor providing a signal composed of a signal from the output of the first multiplier (422) subtracted from a signal from the output of the second multiplier (424).

11. The radar test system of claim 10, wherein the reference oscillator (404) is a numerically controlled oscillator and receives a numerical control input to set a Doppler frequency offset between a signal from the first oscillator (400) and a signal from the second oscillator (402).

12. A radar test system comprising:

a receiving antenna (500) for receiving a radar signal;

a transmitting antenna (600);

a downconverting mixer (536) having a first input coupled to the receiving antenna (500), a second input and an output;

a first oscillator (400) having an output coupled to the second input of the downconverting mixer (536);

a second oscillator (402) having an output;

a bandpass filter (540) having an input coupled to the output of the downconverting mixer, and having an output;

a delay means (552) having an input coupled to the bandpass filter (540) and having an output;

an upconverting mixer (564) having a first input coupled to the output of the delay means (552), a second input coupled to the output of the second oscillator (402), and an output coupled to the transmitting antenna (600);

a first mixer (410) having a first input coupled to the output of the first oscillator (400), a second input coupled to the output of the second oscillator (402), and having an output;

a first phase shifter (414) having an input coupled to the output of the second oscillator (402), and having an output;

a second mixer (408) having a first input coupled to the output of the first oscillator (400), a second input coupled to the output of the first phase shifter (414), and having an output;

a first filter (420) having an input coupled to the output of the first mixer (410), and having an output;

a second filter (418) having an input coupled to the output of the second mixer (408), and having an output;

a reference oscillator (404) having an output;

a first multiplier (422) having a first input coupled to the output of the second filter (418), a second input coupled to the output of the reference oscillator (404), and having an output;

a second phase shifter (426) having a first input coupled to the output of the reference oscillator (404), and having an output;

a second multiplier (424) having a first input coupled to the output of the first filter (420), a second input coupled to the output of the second phase shifter (426), and having an output; and a subtractor (428) having a first input coupled to the output of the first multiplier (422), a second input coupled to the output of the second multiplier (424), and having an output coupled to a frequency control input of the second oscillator (402), the output of the subtractor providing a signal composed of a signal from the output of the first multiplier (422) subtracted from a signal from the output of the second multiplier (424).

* * * * *

UNITED STATES PATENT AND TRADEMARK OFFICE
CERTIFICATE OF CORRECTION

PATENT NO. : 6,384,772 B1
DATED : May 7, 2002
INVENTOR(S) : Donald A. Bradley

It is certified that error appears in the above-identified patent and that said Letters Patent is hereby corrected as shown below:

<u>Title page,</u>
Item [22], please delete "May 1, 2000" and insert therefor -- May 2, 2000 --.

Signed and Sealed this

Sixth Day of August, 2002

*Attest:*

*Attesting Officer*

JAMES E. ROGAN
*Director of the United States Patent and Trademark Office*